(12) United States Patent
Arai

(10) Patent No.: US 11,006,489 B2
(45) Date of Patent: May 11, 2021

(54) OPTICAL DEVICE

(71) Applicant: PIONEER CORPORATION, Tokyo (JP)

(72) Inventor: Kazuaki Arai, Kawagoe (JP)

(73) Assignee: PIONEER CORPORATION, Kawasaki (JP)

( * ) Notice: Subject to any disclaimer, the term of this patent is extended or adjusted under 35 U.S.C. 154(b) by 0 days.

(21) Appl. No.: 16/483,023

(22) PCT Filed: Jan. 30, 2018

(86) PCT No.: PCT/JP2018/002873
§ 371 (c)(1),
(2) Date: Aug. 1, 2019

(87) PCT Pub. No.: WO2018/143161
PCT Pub. Date: Aug. 9, 2018

(65) Prior Publication Data
US 2020/0236751 A1    Jul. 23, 2020

(30) Foreign Application Priority Data
Feb. 2, 2017    (JP) .............................. JP2017-017410

(51) Int. Cl.
*H05B 33/22*    (2006.01)
*H05B 45/10*    (2020.01)
(Continued)

(52) U.S. Cl.
CPC ............. *H05B 33/22* (2013.01); *G01C 3/06* (2013.01); *G01S 7/003* (2013.01); *G01S 7/481* (2013.01);
(Continued)

(58) Field of Classification Search
None
See application file for complete search history.

(56) References Cited

U.S. PATENT DOCUMENTS 7,968,382 B2    6/2011    Jinbo et al.
8,841,656 B2    9/2014    Sugisaki et al.
(Continued)

FOREIGN PATENT DOCUMENTS

CN    103022375 A    4/2013
JP    2009-238833 A    10/2009
(Continued)

OTHER PUBLICATIONS

International Search Report for related International Application No. PCT/JP2018/002873, dated May 1, 2018; 2 pages.

*Primary Examiner* — Ashok Patel
(74) *Attorney, Agent, or Firm* — Procopio, Cory, Hargreaves & Savitch LLP

(57) ABSTRACT

An optical device includes a light-emitting device and a sensor device (a light receiving element). The light-emitting device includes a substrate, a plurality of light-emitting elements, and a plurality of light-transmitting units. The substrate has a first surface and a second surface. The second surface is opposite the first surface. The plurality of light-emitting elements are located on the first surface side of the substrate. Each of the plurality of light-transmitting units is located between light-emitting elements adjacent to each other. The light-emitting device has light-transmitting properties by the plurality of light-transmitting units. Light from the plurality of light-emitting elements is emitted mainly from the second surface of the substrate. The amount of light leakage from light emitted from each light-emitting element and leaked toward the outside of the first surface of the substrate is suppressed.

18 Claims, 15 Drawing Sheets

(51) Int. Cl.
    *H05B 47/105*   (2020.01)
    *G01C 3/06*     (2006.01)
    *G01S 7/00*     (2006.01)
    *G01S 7/481*    (2006.01)
    *H01L 51/50*    (2006.01)
    *H01L 51/52*    (2006.01)
    *H05B 33/26*    (2006.01)

(52) U.S. Cl.
    CPC ...... *H01L 51/5012* (2013.01); *H01L 51/5203* (2013.01); *H05B 33/26* (2013.01); *H05B 45/10* (2020.01); *H05B 47/105* (2020.01)

(56) References Cited

U.S. PATENT DOCUMENTS

| | | | |
|---|---|---|---|
| 8,963,414 B2 | 2/2015 | Sawabe et al. | |
| 8,994,060 B2 | 3/2015 | Jinbo et al. | |
| 9,184,221 B2 | 11/2015 | Jinbo et al. | |
| 9,496,513 B2 | 11/2016 | Aoki | |
| 9,728,736 B2 | 8/2017 | Aoki | |
| 10,319,936 B2 | 6/2019 | Takahashi et al. | |
| 2007/0178631 A1* | 8/2007 | Tanaka | H01L 27/1266 438/166 |
| 2009/0004772 A1 | 1/2009 | Jinbo et al. | |
| 2011/0025212 A1 | 2/2011 | Kolosov et al. | |
| 2011/0248291 A1 | 10/2011 | Jinbo et al. | |
| 2013/0182418 A1 | 7/2013 | Sawabe et al. | |
| 2013/0248825 A1 | 9/2013 | Sugisaki et al. | |
| 2015/0270321 A1 | 9/2015 | Jinbo et al. | |
| 2015/0380670 A1 | 12/2015 | Aoki | |
| 2017/0025628 A1 | 1/2017 | Aoki | |
| 2017/0373268 A1 | 12/2017 | Takahashi et al. | |

FOREIGN PATENT DOCUMENTS

| | | |
|---|---|---|
| JP | 2010-027451 A | 2/2010 |
| JP | 2013-149376 A | 8/2013 |
| JP | 2013-153177 A | 8/2013 |
| JP | 2013-197068 A | 9/2013 |
| JP | 2014-192188 A | 10/2014 |
| JP | 2015-195173 A | 11/2015 |
| WO | 2016/136589 A1 | 9/2016 |

* cited by examiner

OPTICAL DEVICE

CROSS-REFERENCE TO RELATED APPLICATIONS

This application is a U.S. National Stage entry of PCT Application No: PCT/JP2018/002873 filed Jan. 30, 2018, which claims priority to Japanese Patent Application No. 2017-017410, filed Feb. 2, 2017, the contents of which are incorporated herein by reference.

TECHNICAL FIELD

The present invention relates to an optical device.

BACKGROUND ART

In recent years, organic light-emitting diodes (OLEDs) having light-transmitting properties have been developed. Patent Document 1 and Patent Document 2 disclose one example of a light-transmitting OLED. This OLED includes a substrate, a first electrode, an organic layer, and a plurality of second electrodes. The first electrode and the organic layer are laminated on the substrate in order. The plurality of second electrodes are disposed on the organic layer in a striped pattern. Light from outside the OLED can be transmitted through a region between the second electrodes adjacent to each other. Thus, the OLED is provided with light-transmitting properties.

Patent Document 3 describes installing a light-transmitting OLED on a rear window of an automobile. Such a light-transmitting OLED can function as a marker light of an automobile, for example, as a high-mount stop-lamp.

RELATED ART DOCUMENTS

Patent Documents

[Patent Document 1]: Japanese Unexamined Patent Application Publication No. 2013-149376

[Patent Document 2]: Japanese Unexamined Patent Application Publication No. 2013-197068

[Patent Document 3]: Japanese Unexamined Patent Application Publication No. 2015-195173

SUMMARY OF THE INVENTION

As mentioned above, in recent years, there has been progress in the development of OLEDs having light-transmitting properties as light-emitting devices. In a certain use (for example, for a tail lamp), there is a case where such a device is used together with a device (for example, an optical sensor or an image pickup device) having a light receiving element (for example, a photodiode (PD)). In this case, it is necessary to suppress as much as possible false detection of the light receiving element caused by light emitted from the light-emitting device.

An example of the problem to be solved by the present invention is to suppress false detection by a light receiving element caused by light emitted from a light-emitting device.

Means for Solving the Problem

The invention described in claim 1 is an optical device including:
a substrate;
a plurality of light-emitting units located on the substrate, each light-emitting unit including a first electrode, an organic layer, and a second electrode;
a light-transmitting insulating layer covering an end of each first electrode between light-emitting units adjacent to each other out of the plurality of light-emitting units; and
a light receiving element,
in which the insulating layer is continuously located from an end of one first electrode of light-emitting units adjacent to each other to an end of the other first electrode,
in which an end of each second electrode between light-emitting units adjacent to each other is located on the insulating layer, and in which a region overlapped with the insulating layer includes a region functioning as a light-transmitting region.

The invention described in claim 7 is an optical device including:
a substrate;
a light-emitting unit located on the substrate and including a first electrode, an organic layer, and a second electrode;
a light-transmitting first insulating layer having a tapered surface, the first insulating layer covering an end of a first electrode between light-emitting units adjacent to each other out of the plurality of light-emitting units;
a light-transmitting second insulating layer located opposite to the substrate across the light-emitting unit, the second insulating layer covering the first insulating layer and including a surface along the substrate; and
a light receiving element.

BRIEF DESCRIPTION OF DRAWINGS

The objects described above, and other objects, features and advantages are further made apparent by suitable embodiments that will be described below and the following accompanying drawings.

DESCRIPTION OF EMBODIMENTS

Figure 1:
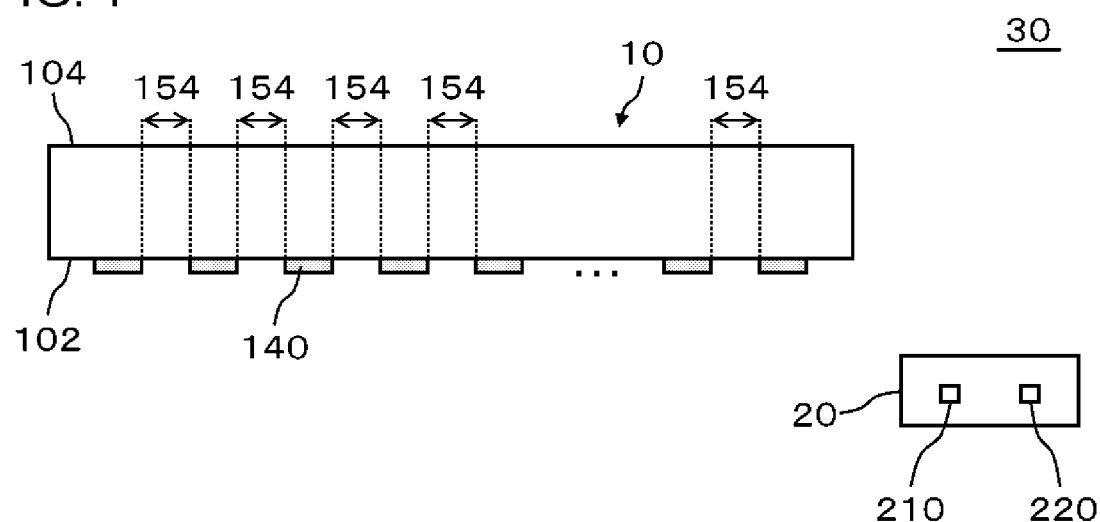
FIG. 1 is a diagram to explain an optical device according to a first embodiment.

Embodiments of the present invention will be described below by referring to the drawings. Moreover, in all the drawings, the same constituent elements are given the same reference numerals, and descriptions thereof will not be repeated.

First Embodiment

FIG. 1 is a diagram to explain an optical device 30 according to the first embodiment.

The optical device 30 includes a light-emitting device 10 and a sensor device 20 (light receiving element 220).

The light-emitting device 10 includes a substrate 100, a plurality of light-emitting elements 140, and a plurality of light-transmitting units 154. The substrate 100 has a first surface 102 and a second surface 104. The second surface 104 is on the opposite side of the first surface 102. The plurality of light-emitting elements 140 are located on the first surface 102 side of the substrate 100. Each of the plurality of light-transmitting units 154 is located between light-emitting elements 140 adjacent to each other. The light-emitting device 10 has light-transmitting properties by the plurality of light-transmitting units 154.

The light-emitting device 10 shown in FIG. 1 has the same configuration as that of the light-emitting device 10, details of which will be described later using FIG. 3 and drawings that follow. As described later using FIG. 3 and the drawings that follow, light from the plurality of light-emitting elements 140 is outputted mainly from the second surface 104 of the substrate 100. Particularly in the present embodiment, the amount of light which is emitted from each light-emitting element 140 and leaked from the first surface 102 side of the substrate 100 is suppressed.

The sensor device 20 is provided in the surroundings of the light-emitting device 10. In the example shown in FIG. 1, the sensor device 20 is obliquely in front of the first surface 102 of the substrate 100. Specifically, the sensor device 20 is located on the first surface 102 side when seen from a direction parallel to the substrate 100 and in a location which is overlapped with neither the first surface 102 nor the second surface 104 when seen from a direction perpendicular to the substrate 100. In another example, the sensor device 20 may be in front of the first surface 102 of the substrate 100 or may be at the side between the first surface 102 and the second surface 104 of the substrate 100. In a further example, the sensor device 20 may be obliquely in front of the second surface 104 of the substrate 100. Specifically, the sensor device 20 may be located on the second surface 104 side of the substrate 100 when seen from a direction parallel to the substrate 100 and in a location which is overlapped with neither the first surface 102 nor the second surface 104 when seen from a direction perpendicular to the substrate 100.

The sensor device 20 performs light sensing to obtain information in the surroundings of the optical device 30. In the example shown in FIG. 1, the sensor device 20 includes a light-emitting element 210 and a light receiving element 220. In one example, the sensor device 20 may be a ranging sensor, particularly, a LiDAR (Light Detection And Ranging). In this example, the light-emitting element 210 emits light toward the outside of the sensor device 20, and the light receiving element 220 receives light emitted from the light-emitting element 210 and reflected by an object. In one example, the light-emitting element 210 may be an element which can convert electric energy into light energy, for example, a laser diode (LD), and the light receiving element 220 may be an element which can convert light energy into electric energy, for example, a photo diode (PD). The sensor device 20 can detect a distance from the sensor device 20 to an object based on time from an emission of light from the light-emitting element 210 to reception of the light by the light receiving element 220.

The light receiving element 220 of the sensor device 20 detects light from the outside of the sensor device 20. Therefore, in order to suppress false detection of the light receiving element 220, it is desirable that light emitted from the light-emitting device 10 is inhibited as much as possible from being incident on the light receiving element 220.

The optical device 30 may be used for performing light emission and light sensing, for example, for an automobile tail lamp with a ranging sensor. In this example, a function of light emission is implemented by the light-emitting device 10, and a function of light sensing is implemented by the sensor device 20.

According to the configuration described above, it is possible to suppress false detection of the light receiving element 220 caused by light emitted from the light-emitting device 10. Specifically, as described above, in the present embodiment, the amount of light which is emitted from each light-emitting element 140 and leaked from the first surface 102 side of the substrate 100 is suppressed. Therefore, it is possible to inhibit light emitted from the light-emitting device 10 from being incident on the sensor device 20 (light receiving element 220). Therefore, it is possible to suppress false detection of the light receiving element 220 caused by light emitted from the light-emitting device 10.

Particularly in the present embodiment, even when the device 20 (light receiving element 220) is in front of or obliquely in front of the first surface 102 of the substrate 100, it is possible to suppress false detection of the light receiving element 220 caused by light emitted from the light-emitting device 10. As described above, in the present embodiment, the amount of light which is emitted from each light-emitting element 140 and leaked from the first surface 102 side of the substrate 100 is suppressed. Therefore, it is possible to inhibit light emitted from the light-emitting device 10 from leaking to the front of or obliquely in front of the first surface 102 of the substrate 100. Therefore, even when the device 20 (light receiving element 220) is in front of or obliquely in front of the first surface 102 of the substrate 100, it is possible to suppress false detection of the light receiving element 220 caused by light emitted from the light-emitting device 10.

Second Embodiment

Figure 2:
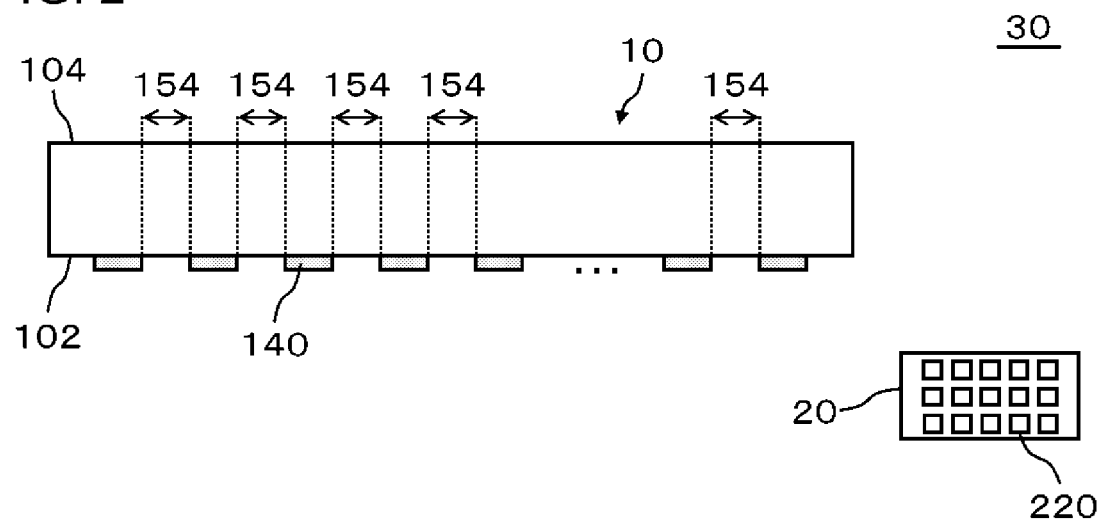
FIG. 2 is a diagram to explain an optical device according to a second embodiment.

FIG. 2 is a diagram to explain an optical device 30 according to a second embodiment and corresponds to FIG.

1 of the first embodiment. The optical device 30 according to the present embodiment is the same as the optical device 30 according to the first embodiment except the following.

The sensor device 20 performs light sensing to obtain information in the surroundings of the optical device 30. In the example shown in FIG. 2, the sensor device 20 includes a plurality of light receiving elements 220. In one example, the sensor device 20 may be an imaging sensor. In this example, the plurality of light receiving elements 220 may be elements which can convert an image into an electric signal, for example, a Charge Coupled Device (CCD) image sensor, or a Complementary Metal-Oxide-Semiconductor (CMOS) image sensor. In one example, each light receiving element 220 may be an element which can convert light energy into electric energy, for example, a photo diode (PD). The sensor device 20 can detect an image of an object outside the sensor device 20 by the plurality of light receiving elements 220.

The light receiving element 220 of the sensor device 20 detects light from outside the sensor device 20. Therefore, in order to prevent false detection by the light receiving element 220, it is desirable to suppress as much as possible the amount of light emitted from the light-emitting device 10 and incident on the light receiving element 220.

The optical device 30 may be used for performing light emission and light sensing, for example, for an automobile tail lamp with an imaging sensor. In this example, a function of light emission is implemented by the light-emitting device 10 and a function of light sensing is implemented by the sensor device 20.

In the present embodiment also, as is the case with the first embodiment, it is possible to suppress false detection of the light receiving element 220 caused by light emitted from the light-emitting device 10.

Third Embodiment

Figure 3:
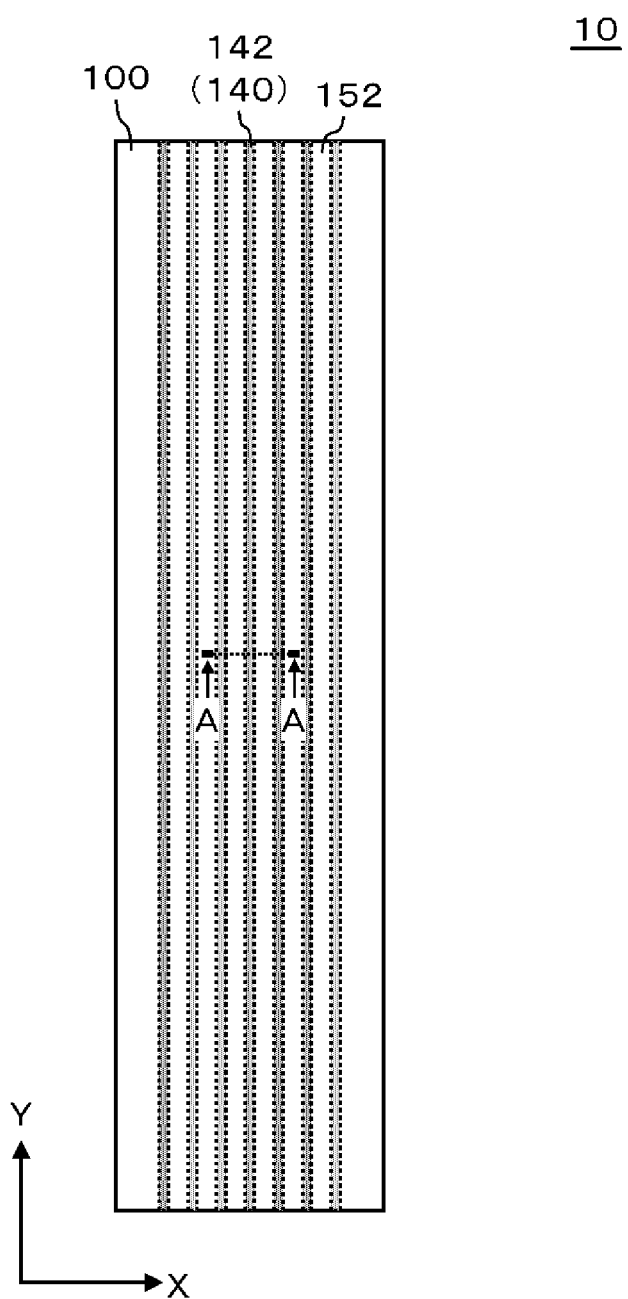
FIG. 3 is a plan view of a light-emitting device according to a third embodiment.
Figure 4:
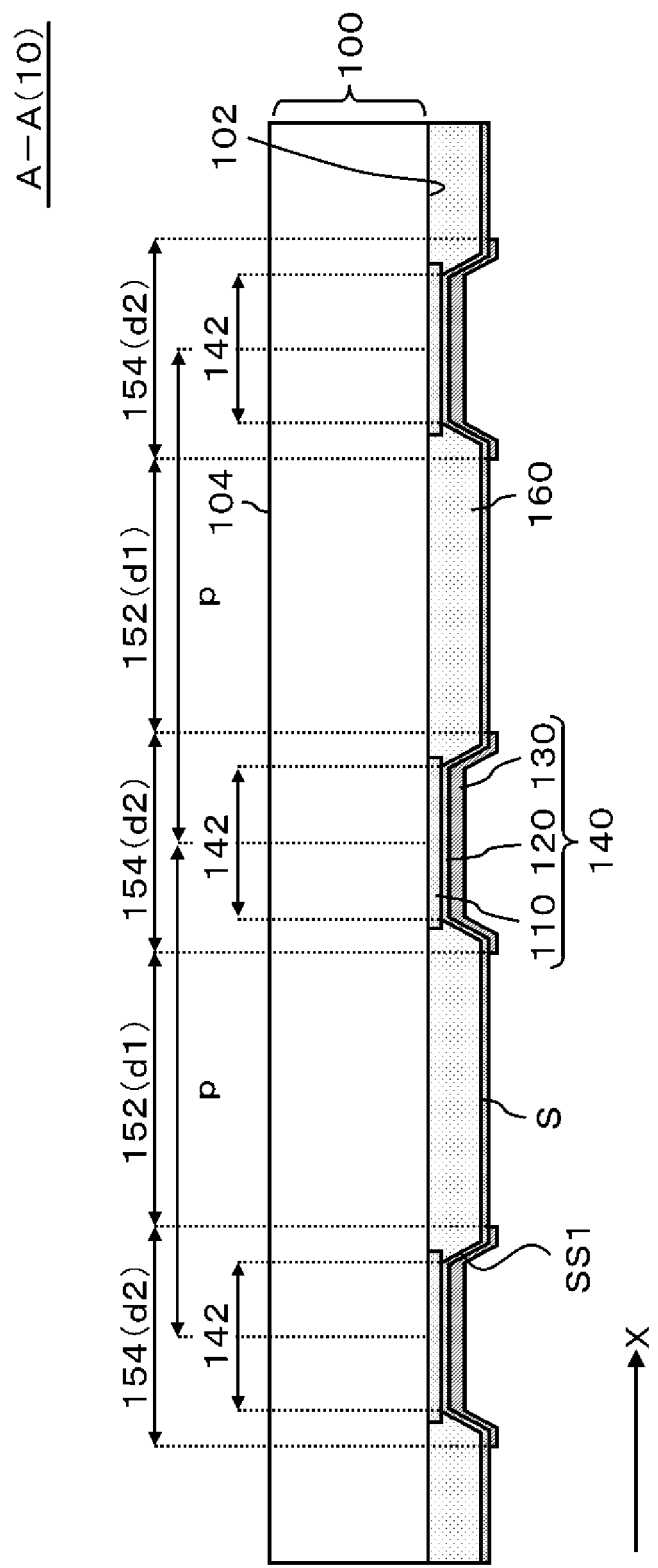
FIG. 4 is an A-A cross-sectional view of FIG. 3.

FIG. 3 is a plan view of a light-emitting device 10 according to a third embodiment. FIG. 4 is an A-A cross-sectional view of FIG. 3. In FIG. 3, a Y direction is defined as the longer direction of a light-emitting unit 142, an X direction is defined as a direction intersecting the Y direction, more specifically, a direction orthogonal to the Y direction, and particularly in the example shown in FIG. 3, the X direction is along the shorter direction of the light-emitting unit 142.

A summary of the light-emitting device 10 is explained using FIG. 4. The light-emitting device 10 includes a substrate 100, a plurality of light-emitting units 142, and an insulating layer 160. The plurality of light-emitting units 142 are located on the substrate 100, and each light-emitting unit 142 includes a first electrode 110, an organic layer 120, and a second electrode 130. The insulating layer 160 covers an end of each first electrode 110 between light-emitting units 142 adjacent to each other out of the plurality of light-emitting units 142. The insulating layer 160 has light-transmitting properties and is located continuously from the end the first electrodes 110 of one of the light-emitting units 142 adjacent to each other to the end of the first electrode 110 of the other light-emitting unit 142. An end of each second electrode 130 between the light-emitting units 142 adjacent to each other is located over the insulating layer 160. A region overlapped with the insulating layer 160 includes a region functioning as a light-transmitting region 152.

According to the configuration described above, it is possible to suppress the amount of light leakage to the opposite side of a light-emitting surface (second surface 104 of substrate 100) of the light-emitting device 10. Specifically, in the configuration described above, the insulating layer 160 is located continuously from the end the first electrode 110 of one of the light-emitting units 142 adjacent to each other to the end of the first electrode 110 of the other light-emitting unit 142. The insulating layer 160 has a surface S exposed from each second electrode 130 between light-emitting units 142 adjacent to each other. According to the configuration described above, the surface S may be along the light-emitting surface (second surface 104 of substrate 100) of the light-emitting device 10. In this case, as described later using FIG. 5 and FIG. 6, when light emitted from the light-emitting unit 142 and reflected on the light-emitting surface of the light-emitting device 10 (second surface 104 of substrate 100) by a total reflection reaches a medium of the insulating layer 160 on the surface S side, an incident angle of this light is large. Therefore, this light is reflected toward the light-emitting surface of the light-emitting device 10 (second surface 104 of substrate 100) by the total reflection. In addition, when light emitted from the light-emitting unit 142 and reflected on the light-emitting surface of the light-emitting device 10 (second surface 104 of substrate 100) by Fresnel reflection reaches the medium of the insulating layer 160 on the surface S side, light out of this Fresnel reflection light that has a large incident angle is reflected toward the light-emitting surface of the light-emitting device 10 (second surface 104 of substrate 100) by the total reflection. In this manner, it is possible to suppress the amount of light leakage to the opposite side of the light-emitting surface (second surface 104 of substrate 100) of the light-emitting device 10.

Next, details of a plan layout of the light-emitting device 10 are described using FIG. 3. The light-emitting device 10 includes the substrate 100, the plurality of light-emitting units 142 (a plurality of light-emitting elements 140), and the plurality of light-transmitting regions 152.

The plurality of light-emitting units 142 are aligned along the X direction and extend to the Y direction. Thus, the plurality of light-emitting units 142 are aligned in a striped pattern. Particularly in the example shown in FIG. 3, the plurality of light-emitting units 142 are disposed at regular intervals.

Each of a plurality of light-transmitting regions 152 is located between light-emitting units 142 adjacent to each other. Thus, the plurality of light-transmitting regions 152 and the plurality of light-emitting units 142 are alternately aligned along the X direction.

Next, details of a cross-sectional structure of the light-emitting device 10 are described using FIG. 4. The light-emitting device 10 includes the substrate 100, the plurality of light-emitting elements 140, and the insulating layer 160. Each light-emitting element 140 has the first electrode 110, the organic layer 120, and the second electrode 130 in order from the substrate 100.

The substrate 100 includes a first surface 102 and a second surface 104. The plurality of light-emitting elements 140 and the insulating layer 160 are located on the first surface 102 side of the substrate 100. The second surface 104 is on the opposite side of the first surface 102. The second surface 104 functions as a light-emitting surface of the light-emitting device 10 and light from the plurality of light-emitting elements 140 is outputted mainly from the second surface 104. That is, a luminous flux of light emitted from the light-emitting device 10 on the second surface 104 side is larger than a luminous flux of light emitted from the light-emitting device 10 on the first surface 102 side.

The substrate 100 has light-transmitting properties. Therefore, light emitted from each light-emitting element 140 can be transmitted through the substrate 100. In addition, light received from outside the light-emitting device 10 may be transmitted through the substrate 100. More specifically, the light can be transmitted from the first surface 102 side of the substrate 100 to the second surface 104 side of the substrate 100, and the light can be transmitted from the second surface 104 side of the substrate 100 toward the first surface 102 side of the substrate 100.

The substrate 100 includes a material having light-transmitting properties, and in one example, includes glass or resin.

The first electrode 110 has light-transmitting properties. Therefore, light emitted from the organic layer 120 can be transmitted through the first electrode 110, and thereby, the light can be incident on the substrate 100.

The first electrode 110 includes a material having light-transmitting properties and conductivity, and in one example, the first electrode 110 includes a metal oxide, more specifically for example, at least one of an indium tin oxide (ITO) and an indium zinc oxide (IZO).

The organic layer 120 can emit light by organic electroluminescence (EL). In one example, the organic layer 120 includes, for example, a hole injection layer (HIL), a hole transport layer (HTL), a light-emitting layer (EML), an electron transport layer (ETL), and an electron injection layer (EIL). The EML emits light by recombination of holes injected from the first electrode 110 via the HIL and the HTL and electrons injected from the second electrode 130 via the EIL and the ETL.

In the example shown in FIG. 4, the organic layer 120 extends across the plurality of light-emitting elements 140, and covers the surface S of the insulating layer 160 between the light-emitting units 142 adjacent to each other. In other words, the plurality of light-emitting elements 140 have a common organic layer 120.

The second electrode 130 is located facing the first electrode 110. For example, the second electrode 130 has light shielding properties, specifically, light reflectivity and light absorption properties. Therefore, light emitted from the organic layer 120 is reflected by or absorbed by the second electrode 130 without being transmitted through the second electrode 130. On the other hand, the second electrode 130 may have light-transmitting properties. In this manner, light transmittance of the entire light-emitting device 10 is improved. In addition, light transmittance of the second electrode 130 may vary depending on the location in the light-emitting device 10.

The second electrode 130 has a material having conductivity, and in a case where the second electrode 130 has light shielding properties, the second electrode 130 includes a metal, specifically for example, at least one of Al, Ag, and MgAg. In addition, in a case where the second electrode 130 has light-transmitting properties, the second electrode 130 may be formed by forming the above mentioned materials into a thin film (for example, of equal to or less than 100 nm) or by using the above-mentioned materials of the first electrode 110.

The insulating layer 160 defines the light-emitting unit 142 of the light-emitting element 140. Specifically, the insulating layer 160 covers an end of each first electrode 110 to expose a portion of each first electrode 110. The insulating layer 160 has a side surface SS1 which intersects a surface of the first electrode 110, and the organic layer 120 and the second electrode 130 are laminated on the first electrode 110 further on the inner side than the side surface SS1. In this manner, the light-emitting element 140 has a region functioning as the light-emitting unit 142, that is, a laminate of the first electrode 110, the organic layer 120, and the second electrode 130.

The insulating layer 160 includes an insulating material having light transmittance, for example, an organic insulating material (for example, a polyimide), or an inorganic insulating material (for example, a silicon oxide ($SiO_2$), a silicon nitride (SiN), or a silicon oxynitride (SiON)). Particularly, from the viewpoint of optical transparency, the insulating layer 160 preferably includes an inorganic insulating material.

The light-emitting device 10 has the plurality of light-transmitting regions 152 and a plurality of light shielding regions 154. Each light-transmitting region 152 is exposed from a light shielding material, specifically, the second electrode 130. Each light shielding region 154 is overlapped with a light shielding material, specifically, the second electrode 130. Light from outside the light-emitting device 10 can be transmitted through the light-transmitting region 152, and specifically, the light can be transmitted from the first surface 102 side of the substrate 100 toward the second surface 104 side of the substrate 100 and transmitted from the second surface 104 side of the substrate 100 toward the first surface 102 side of the substrate 100. Particularly, the insulating layer 160 has the surface S exposed from each second electrode 130 in the light-transmitting region 152. The surface S is along the second surface 104 of the substrate 100, and specifically, is parallel to the second surface 104 of the substrate 100. Light from the outside is prevented from being transmitted through the light shielding region 154 by the second electrode 130.

The light-emitting device 10 can function as a semi-transparent OLED by the plurality of light-transmitting regions 152. Specifically, in a case where light is not emitted from the plurality of light-emitting units 142, an object on the first surface 102 side is visible through the light-emitting device 10 from the second surface 104 side and an object on the second surface 104 side is visible through the light-emitting device 10 from the first surface 102 side to the human eye by the plurality of light-transmitting regions 152. Further, light from the plurality of light-emitting units 142 is mainly emitted from the second surface 104 side and is hardly emitted from the first surface 102 side. In a case where light is emitted from the plurality of light-emitting units 142, the object on the second surface 104 side is visible through the light-emitting device 10 from the first surface 102 side to the human eye by the plurality of light-transmitting regions 152.

From the viewpoint of improving light transmittance of the light-emitting device 10, a width d1 of the light-transmitting region 152 is preferably wide to a certain degree, and in one example, the width d1 may be made wider than a width d2 of the light shielding region 154 (that is, the width of the second electrode 130) (d1>d2).

Figure 5:
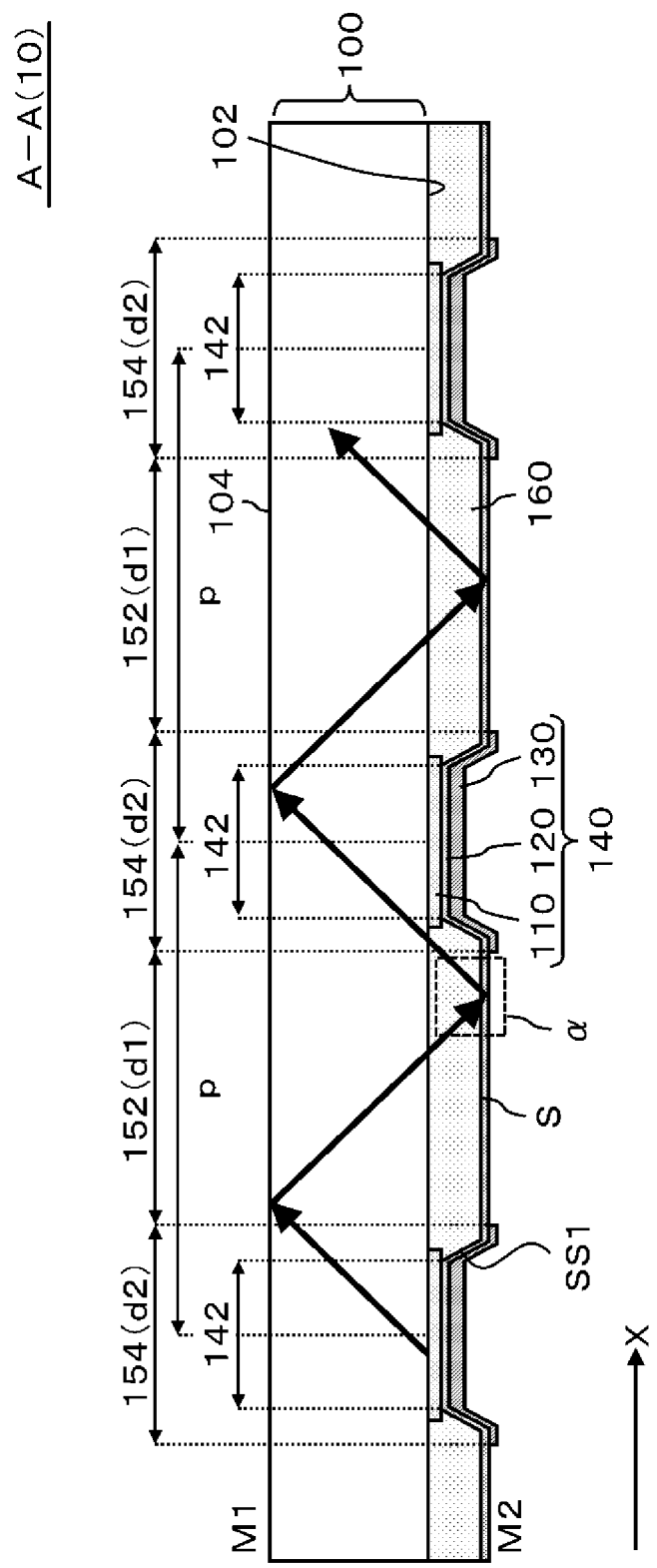
FIG. 5 is a diagram to explain FIG. 3 and an example of the operation of the light-emitting device shown in FIG. 3.
Figure 6:
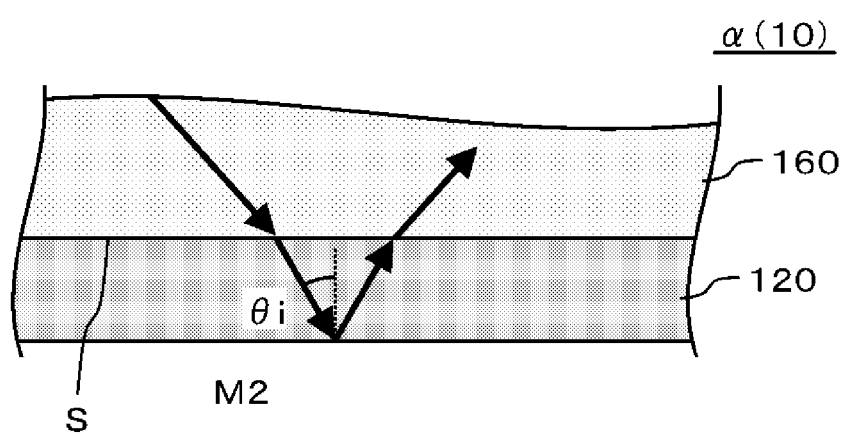
FIG. 6 is an enlarged diagram of a region α of FIG. 5.

FIG. 5 is a diagram to explain an example of the operation of the light-emitting device 10 shown in FIG. 3 and FIG. 4. FIG. 6 is an enlarged diagram of a region α of FIG. 5. In the example shown in FIG. 5 and FIG. 6, a medium M1 is located on the second surface 104 side of the substrate 100, and a medium M2 is located on the first surface 102 side of the substrate 100. The medium M1 and the medium M2 are the same media, specifically, air.

In the example shown in FIG. 5, light emitted from the light-emitting unit 142 is reflected on an interface between the second surface 104 of the substrate 100 and the medium M1 by a total reflection. This light is transmitted through the substrate 100 and the insulating layer 160 and reaches the surface S of the insulating layer 160. As shown in FIG. 6, this light is incident on an interface between the organic layer 120 and the medium M2 in the region α at an incident angle θi.

In the example shown in FIG. 5 and FIG. 6, it is possible to suppress the amount of light leakage to the opposite side of the light-emitting surface (second surface 104 of substrate 100) of the light-emitting device 10 via the surface S of the insulating layer 160. In detail, the surface S is along the second surface 104 of the substrate 100, and specifically, is parallel to the second surface 104 of the substrate 100. With such a configuration, it is possible to make an incident angle on the surface S of the insulating layer 160 or the incident angle θi of light on the interface between the organic layer 120 and the medium M2 large. Therefore, reflected light totally reflected on the interface between the substrate 100 and the medium M1 can be totally reflected on the surface S of the insulating layer 160, making it possible to prevent the occurrence of light (leaked light) to the first surface 102 side of the substrate 100 of the light-emitting device 10. Moreover, of Fresnel reflection light Fresnel-reflected at an interface between the substrate 100 and the medium M1, light at an angle to be totally reflected on the surface S of the insulating layer 160 can be totally reflected on the surface S or at an interface between the organic layer 120 and the medium M2, thus allowing to reduce leaked light. In this manner, it is possible to suppress the amount of light leakage to the opposite side of the light-emitting surface (second surface 104 of substrate 100) of the light-emitting device 10 via the surface S of the insulating layer 160.

Figure 7:
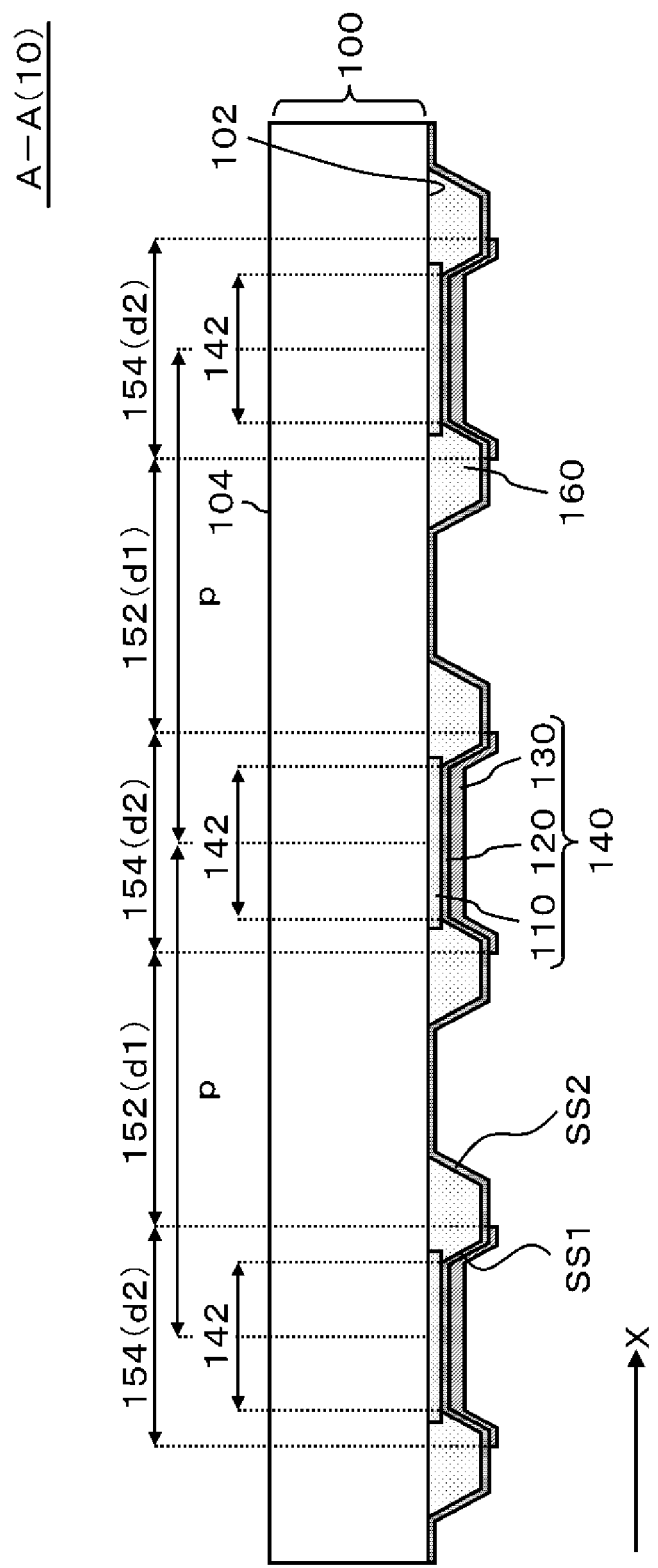
FIG. 7 is a cross-sectional view showing a light-emitting device according to a comparative example.

FIG. 7 is a cross-sectional view showing the light-emitting device 10 according to a comparative example, and corresponds to FIG. 4 of the third embodiment. The light-emitting device 10 according to the comparative example is the same as the light-emitting device 10 according to the third embodiment except for the following.

In the light-emitting device 10 shown in FIG. 7, insulating layers 160 defining each light-emitting unit 142 are separated from each other. The first surface 102 of the substrate 100 is exposed from the insulating layer 160 between the insulating layers 160 adjacent to each other, and is covered with the organic layer 120.

Each insulating layer 160 has a side surface SS2 on the opposite side of a side surface SS1. The side surface SS2 is not along the second surface 104 of the substrate 100, but is along a direction which is inclined from the second surface 104 of the substrate 100.

Figure 8:
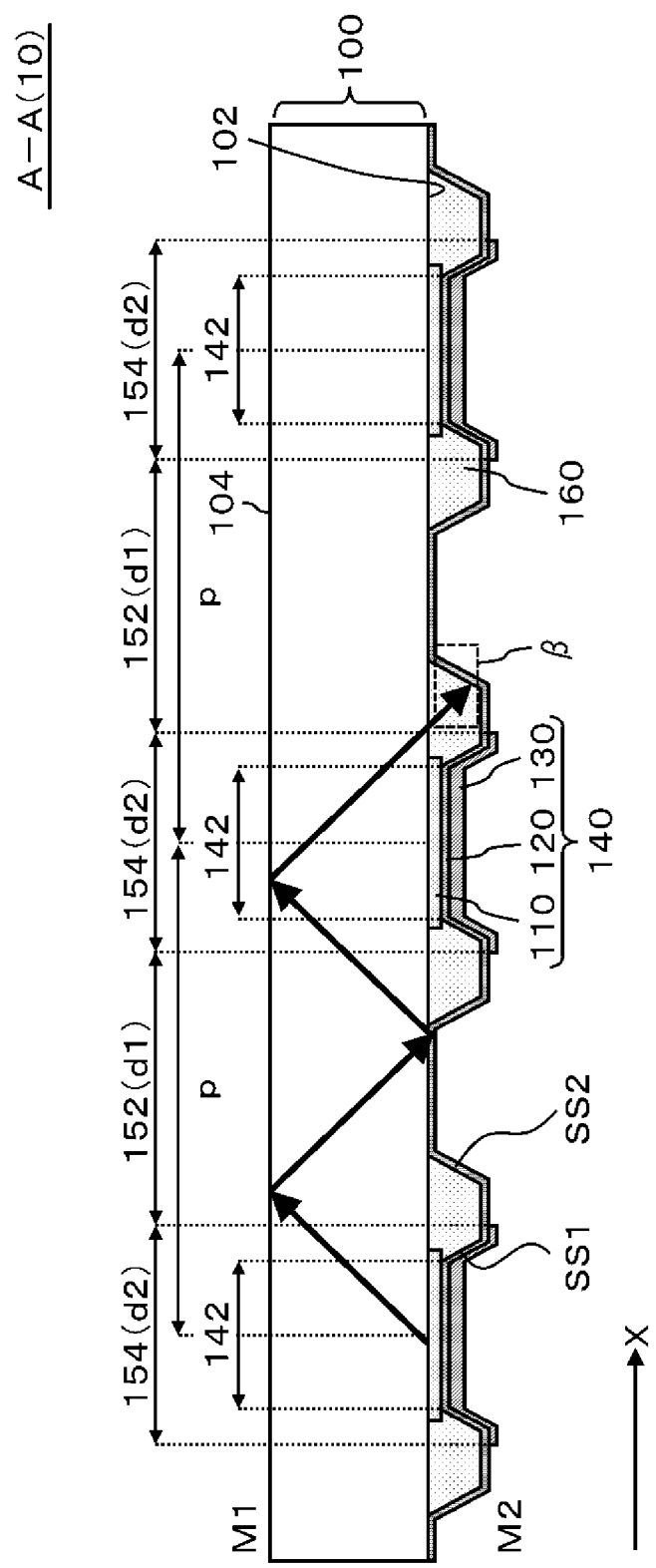
FIG. 8 is a diagram to explain one example of the operation of the light-emitting device shown in FIG. 7.
Figure 9:
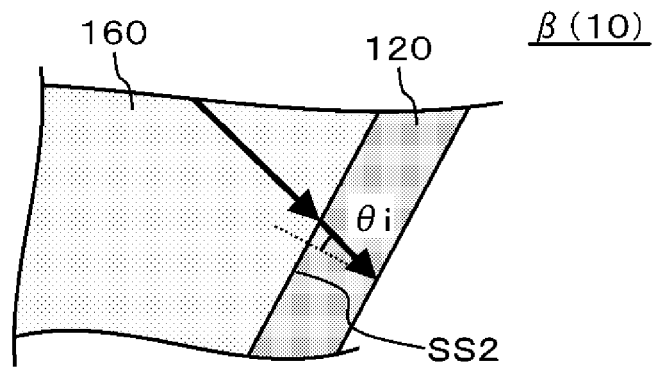
FIG. 9 is an enlarged diagram of a region β of FIG. 8.

FIG. 8 is a diagram to explain one example of the operation of the light-emitting device 10 shown in FIG. 7. FIG. 9 is an enlarged diagram of a region β of FIG. 8. In the example shown in FIG. 8 and FIG. 9, the medium M1 is located on the second surface 104 side of the substrate 100, and the medium M2 is located on the first surface 102 side of the substrate 100. The medium M1 and the medium M2 are the same media, specifically, air.

In the example shown in FIG. 8, light emitted from the light-emitting unit 142 is reflected on an interface between the second surface 104 of the substrate 100 and the medium M1 by a total reflection. Particularly in the example shown in FIG. 8, this light is reflected on an interface between the organic layer 120 and the medium M1 between light-emitting units 142 adjacent to each other by a total reflection, and in addition, this light is reflected on the interface between the second surface 104 of the substrate 100 and the medium M1 by a total reflection. As shown in FIG. 9, this light is incident on the interface between the organic layer 120 and the medium M2 in the region β at the incident angle θi.

In the example shown in FIG. 8 and FIG. 9, the amount of light leakage to the opposite side of the light-emitting surface (second surface 104 of substrate 100) of the light-emitting device 10 via the side surface SS2 of the insulating layer 160 is large. In detail, the side surface SS2 is not along the second surface 104 of the substrate 100, specifically, but is along the direction which is inclined from the second surface 104 of the substrate 100. With such a configuration, light out of light from the light-emitting unit 142 incident at the incident angle θ0 and totally reflected on the second surface 104 of the substrate 100 enters the side surface SS2 of the insulating layer 160 at an angle θi which is different from the angle θ0, and as a result, the light is emitted to the medium M2 side as leaked light via the insulating layer 160 without the occurrence of a total reflection. That is, when the side surface SS2 is formed on the insulating layer 160, the incident angle θi at the interface between the organic layer 120 and the medium M2 is small. Therefore, in the region R, a large portion of light totally reflected on the second surface 104 of the substrate 100 having reached the interface between the organic layer 120 and the medium M2 is transmitted through toward the medium M2 side. Thus, the amount of light leakage to the opposite side of the light-emitting surface (second surface 104 of substrate 100) of the light-emitting device 10 via the side surface SS2 of the insulating layer 160 is large.

Meanwhile, in the configuration according to the comparative example, the light-transmitting unit 152 has high light transmittance in a portion not formed with the insulating layer 160. Therefore, in one portion of the light-emitting device 10, the insulating layer 160 may be formed to have a surface S, and in another portion thereof, the insulating layer may be formed to be divided. The designer can adequately design considering the transmittance and the amount of leaked light. For example, near the center of the light-emitting device 10, the insulating layer 160 may be provided divided in order to increase the transmittance, while in the surroundings, the surface S may be formed to reduce leaked light.

Figure 10:
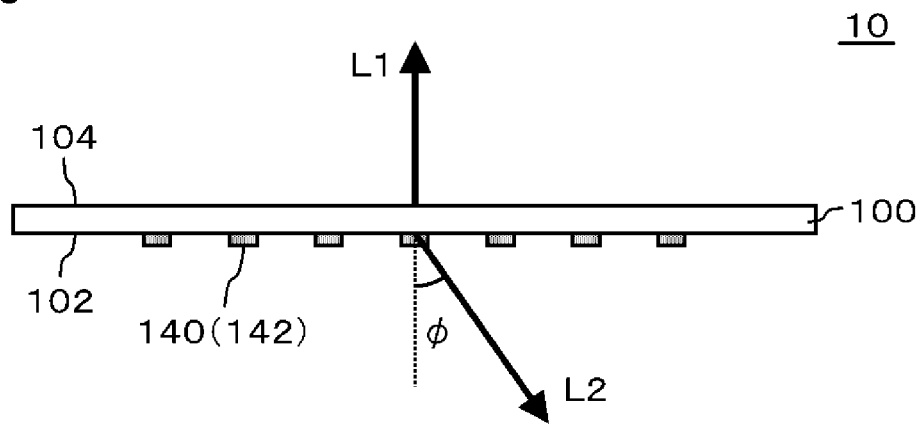
FIG. 10 is a diagram to explain details of a light distribution of a light-emitting device.

FIG. 10 is a diagram to explain details of the light distribution of the light-emitting device 10. In the example shown in FIG. 10, the light distribution of the light-emitting device 10 has a luminous intensity L1 (first luminous intensity) in the front direction of the second surface 104 (that is, a direction perpendicular to the second surface 104) and a luminous intensity L2 (second luminous intensity) in a direction inclined by an angle φ from the front direction of the first surface 102 (that is, a direction perpendicular to the first surface 102).

Figure 11:
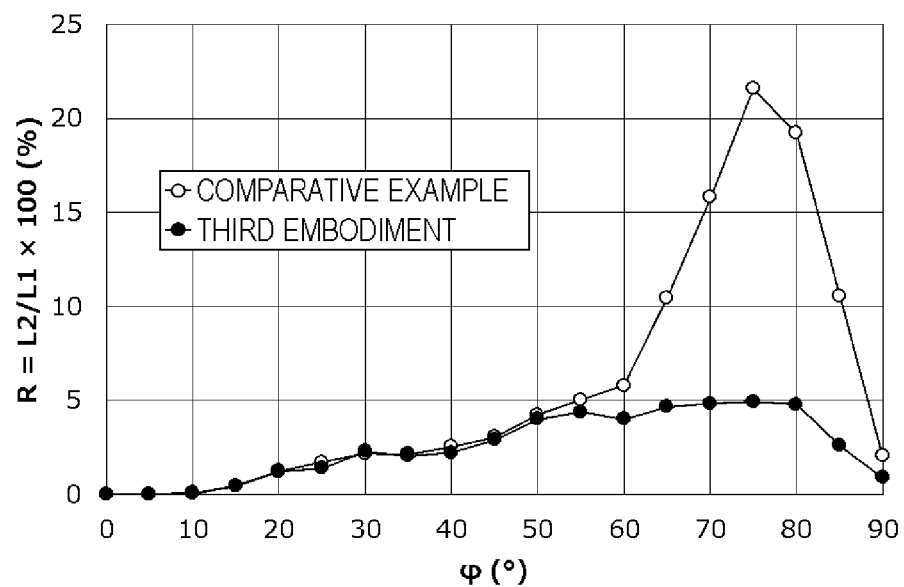
FIG. 11 is a diagram to show simulation results of the amounts of light leaked to the opposite side of a light-emitting surface for each of a light-emitting device (FIG. 4) according to a third embodiment and a light-emitting device (FIG. 7) according to a comparative example.

FIG. 11 is a diagram to show simulation results of the amount of light leaked to the opposite side of the light-emitting surface (second surface 104 of substrate 100) for each of the light-emitting devices 10 according to the third embodiment (FIG. 4) and according to the comparative example (FIG. 7). The vertical axis of the graph of FIG. 11 shows a luminous intensity ratio R in the luminous intensity L2 (FIG. 10) with respect to the luminous intensity L1 (FIG. 10), and the horizontal axis of the graph of FIG. 11 shows the angle φ (FIG. 10) of the luminous intensity L2.

Conditions of each of the light-emitting devices 10 according to the third embodiment and according to the comparative example in the simulation in FIG. 11 are as follows.

A glass substrate (refractive index: 1.52) was used for the substrate 100. The substrate 100 had a rectangular shape having short sides which are 10 mm long along the X direction and long sides which are 40 mm long along the Y direction. The substrate 100 has a thickness of 0.2 mm.

There were seven light-emitting elements 140 (light-emitting units 142). The seven light-emitting units 142 were arranged at a pitch p of 0.714 mm. Each light-emitting unit 142 had a width of 0.2 mm, and each second electrode 130 of each light-emitting unit 142 had a width (width d2 of light shielding region 154) of 0.25 mm.

The insulating layer 160 had a thickness of 0.7 μm. The refractive index of the insulating layer 160 was 1.65.

As shown in FIG. 11, the luminous intensity ratios R remain at approximately the same level as each other in either of the third embodiment and the comparative example when the angle φ is equal to or greater than 0 degrees and equal to or less than 50 degrees. When the angle φ is equal to or greater than 55 degrees and equal to or less than 60 degrees, the luminous intensity ratio R in the comparative example is slightly greater than that in the third embodiment. When the angle φ is equal to or greater than 65 degrees and equal to or less than 85 degrees, the luminous intensity ratio R in the third embodiment is equal to or less than 10%, and more specifically, is approximately equal to or less than 5%, while the luminous intensity ratio R in the comparative example exceeds 10%. Particularly when the angle φ is equal to or greater than 70 degrees and equal to or less than 80 degrees, the luminous intensity ratio R in the comparative example is considerably greater than the luminous intensity ratio R in the third embodiment, and specifically, exceeds 15%.

In the example shown in FIG. 11, the luminous intensity ratio R in the third embodiment remains low in any direction, and specifically, remains to be equal to or less than 10%, and particularly, remains to be equal to or less than approximately 5% in any case where the angle φ is equal to or greater than 0 degrees and equal to or less than 90 degrees.

The reason for the low luminous intensity ratio R in the third embodiment in FIG. 11 in any direction is assumed to be, as explained using FIGS. 5 and 6, due to the suppressed amount of light leakage to the opposite side of the light-emitting surface (second surface 104 of substrate 100) of the light-emitting device 10 via the surface S of the insulating layer 160.

The reason for the high luminous intensity ratio R in the comparative example in some directions (equal to or greater than approximately 65 degrees and equal to or less than approximately 85 degree for the angle φ) in FIG. 11 is assumed to be, as explained using FIGS. 8 and 9, due to a large amount of light leakage to the opposite side of the light-emitting surface (second surface 104 of substrate 100) of the light-emitting device 10 via the side surface SS2 of the insulating layer 160.

As mentioned above, according to the present embodiment, it is possible to suppress the amount of light leakage to the opposite side of the light-emitting surface (second surface 104 of substrate 100) of the light-emitting device 10.

Fourth Embodiment

Figure 12:
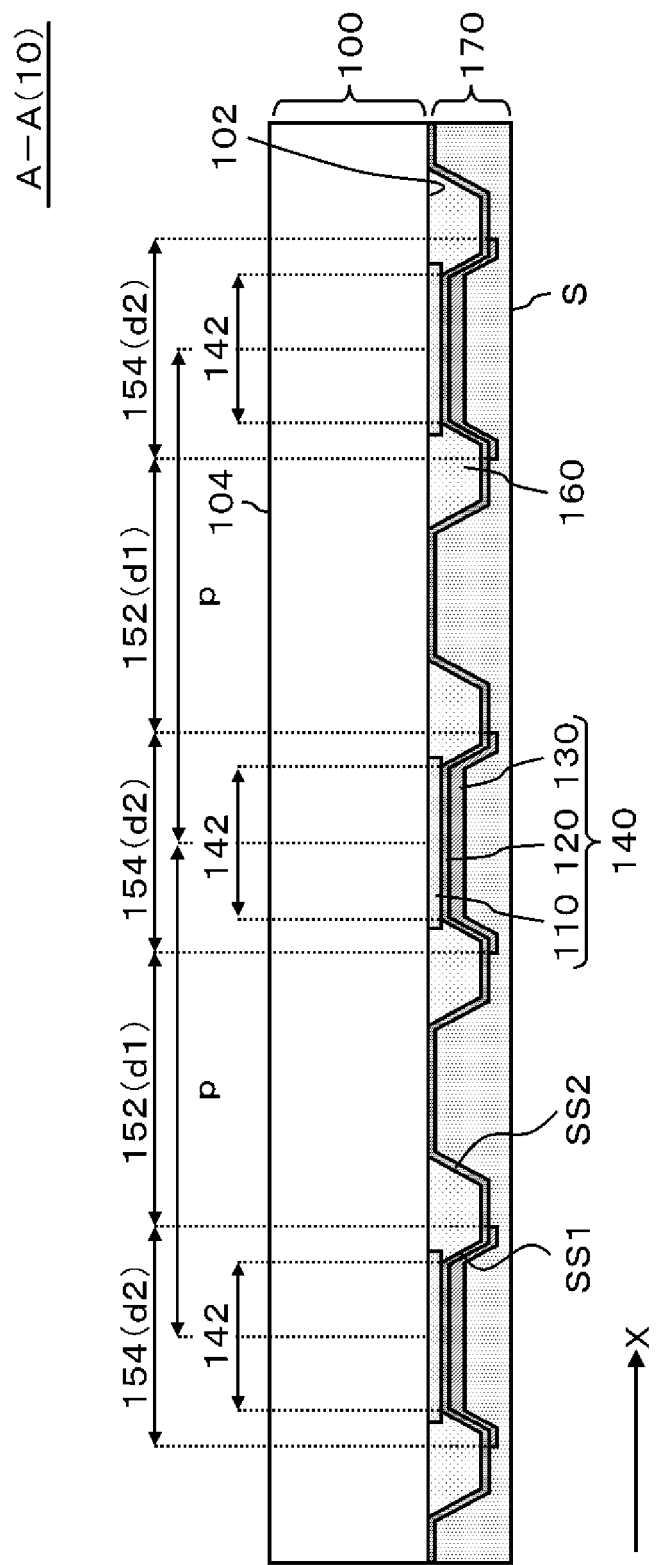
FIG. 12 is a cross-sectional view showing a light-emitting device according to a fourth embodiment.

FIG. 12 is a cross-sectional view showing a light-emitting device 10 according to a fourth embodiment, and corresponds to FIG. 4 of the third embodiment. The light-emitting device 10 according to the present embodiment is the same as the light-emitting device 10 according to the third embodiment except for the following.

In the light-emitting device 10 shown in FIG. 12, the insulating layers 160 defining each light-emitting unit 142 are separated from each other. The first surface 102 of the substrate 100 is exposed from the insulating layer 160 between the insulating layers 160 adjacent to each other, and is covered with the organic layer 120.

Each insulating layer 160 has the side surface SS1 and the side surface SS2. The side surface SS1 and the side surface SS2 are tapered surfaces. The side surface SS1 is not along the second surface 104 of the substrate 100, but is along the direction which is inclined from the second surface 104 of the substrate 100. The side surface SS2 is on the opposite side of the side surface SS1. The side surface SS2 is not along the second surface 104 of the substrate 100, but is along the direction which is inclined from the second surface 104 of the substrate 100.

The light-emitting device 10 includes an insulating layer 170. The insulating layer 170 extends across the plurality of light-emitting elements 140, and covers the plurality of light-emitting elements 140. The insulating layer 170 has light-transmitting properties.

The insulating layer 170 has the surface S. The surface S faces the opposite side of the second surface 104 of the substrate 100. Further, the surface S is along the substrate 100, specifically, the second surface 104 of the substrate 100, and more specifically, is parallel to the second surface 104 of the substrate 100. Particularly, the surface S is along the second surface 104 of the substrate 100 in each light-transmitting region 152, specifically, is parallel to the second surface 104 of the substrate 100 in each light-transmitting region 152. The material of the insulating layer 170 is preferably the same as that of the insulating layer 160 but may be a different material.

Figure 13:
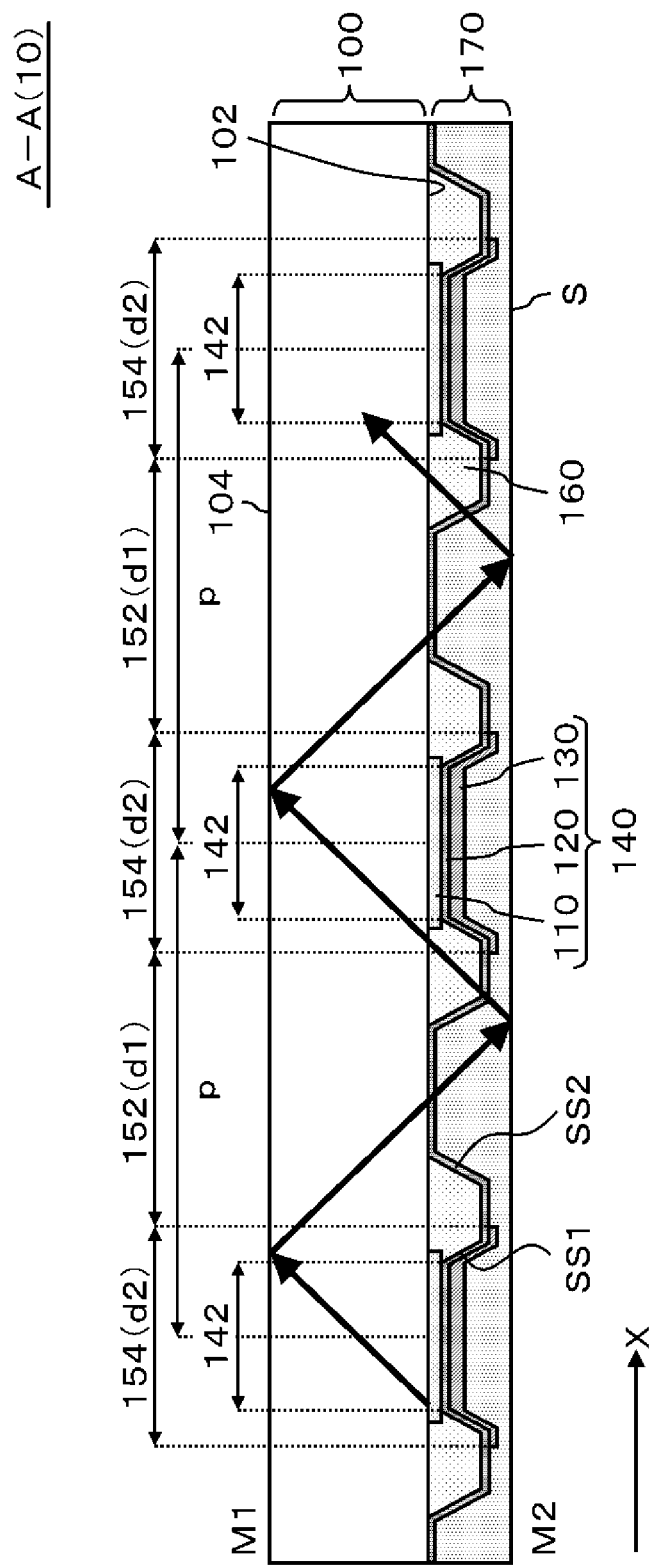
FIG. 13 is a diagram to explain one example of the operation of the light-emitting device shown in FIG. 12.

FIG. 13 is a diagram to explain one example of the operation of the light-emitting device 10 shown in FIG. 12, and corresponds to FIG. 5 of the third embodiment. As is the case with the example shown in FIG. 5, in the example shown in FIG. 13, the medium M1 is located on the second surface 104 side of the substrate 100, and the medium M2 is located on the first surface 102 side of the substrate 100. The medium M1 and the medium M2 are the same media, specifically, air.

In the example shown in FIG. 13, light emitted from the light-emitting unit 142 is reflected on the interface between the second surface 104 of the substrate 100 and the medium M1 by a total reflection. This light is transmitted through the substrate 100 and the insulating layer 160 and reaches the surface S of the insulating layer 160. This light reaches an interface between the insulating layer 170 and the medium M2.

In the example shown in FIG. 13, as is the case with the example shown in FIGS. 5 and 6, it is possible to suppress the amount of light leakage to the opposite side of the light-emitting surface (second surface 104 of substrate 100) of the light-emitting device 10 via the surface S of the insulating layer 170. In detail, the surface S is along the second surface 104 of the substrate 100. Specifically, the surface S is parallel to the second surface 104 of the substrate 100. With such a configuration, reflected light totally reflected on the second surface 104 of the substrate 100 can also be totally reflected on the surface S. Specifically, an incident angle of light on the interface between the insulating layer 170 and the medium M2 can be increased up to an angle at which a total reflection occurs. Therefore, as is the case with the example shown in FIGS. 5 and 6, it is possible to suppress the amount of light leakage to the opposite side of the light-emitting surface (second surface 104 of substrate 100) of the light-emitting device 10 via the surface S of the insulating layer 170. Further, the difference in refractive indexes is preferably made small by the insulating layer 160 and the insulating layer 170 containing the same material and the like. Further, the refractive index of the insulating layer 160 and that of the insulating layer 170 are preferably the same. By adopting such a configuration, refraction is prevented from occurring at an interface between the insulating layer 160 and the insulating layer 170 even when reflected light totally reflected on the second surface 104 of the substrate 100 becomes incident on the insulating layer 170 through the insulating layer 160, and as a result, the reflected light through the insulating layer 160 can enter the insulating layer 170 at an angle at which the reflected light is totally reflected on the surface S.

Figure 14:
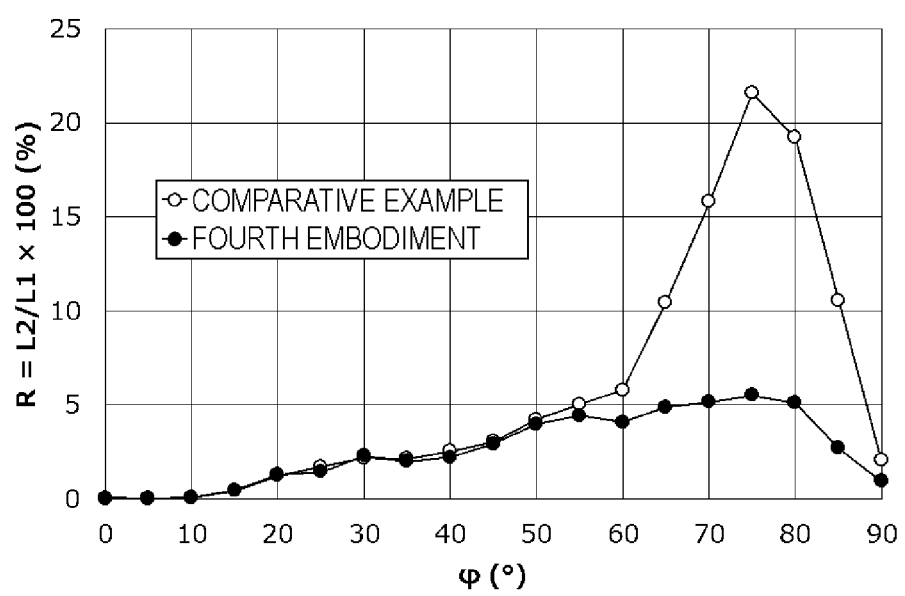
FIG. 14 is a diagram to show simulation results of the amounts of light leaked to the opposite side of a light-emitting surface for each of a light-emitting device (FIG. 12) according to a fourth embodiment and a light-emitting device (FIG. 7) according to a comparative example.

FIG. 14 is a diagram to show simulation results of the amount of light leaked to the opposite side of the light-emitting surface (second surface 104 of substrate 100) for each of the light-emitting devices 10 according to the fourth embodiment (FIG. 12) and according to the comparative example (FIG. 7), and corresponds to FIG. 11 of the third embodiment.

The conditions for the light-emitting device 10 according to the fourth embodiment in the simulation of FIG. 14 is the same as those for the light-emitting device 10 according to the third embodiment in the simulation of FIG. 11 except that the thickness of the insulating layer 170 is 1 µm.

In the example shown in FIG. 14, as is the case with the luminous intensity ratio R of the third embodiment shown in FIG. 11, the luminous intensity ratio R of the fourth embodiment remains low in any direction, and is equal to or less than 10%, in particular, equal to or less than approximately 5% in any case where the angle φ is equal to or greater than 0 degrees and equal to or less than 90 degrees.

The reason for the low luminous intensity ratio R in the fourth embodiment in FIG. 14 in any direction is assumed to be, as explained using FIG. 13, due to the suppressed amount of light leakage to the opposite side of the light-emitting surface (second surface 104 of substrate 100) of the light-emitting device 10 via the surface S of the insulating layer 170.

In the present embodiment also, it is possible to suppress the amount of light leakage to the opposite side of the light-emitting surface (second surface 104 of substrate 100) of the light-emitting device 10.

Example

Figure 15:
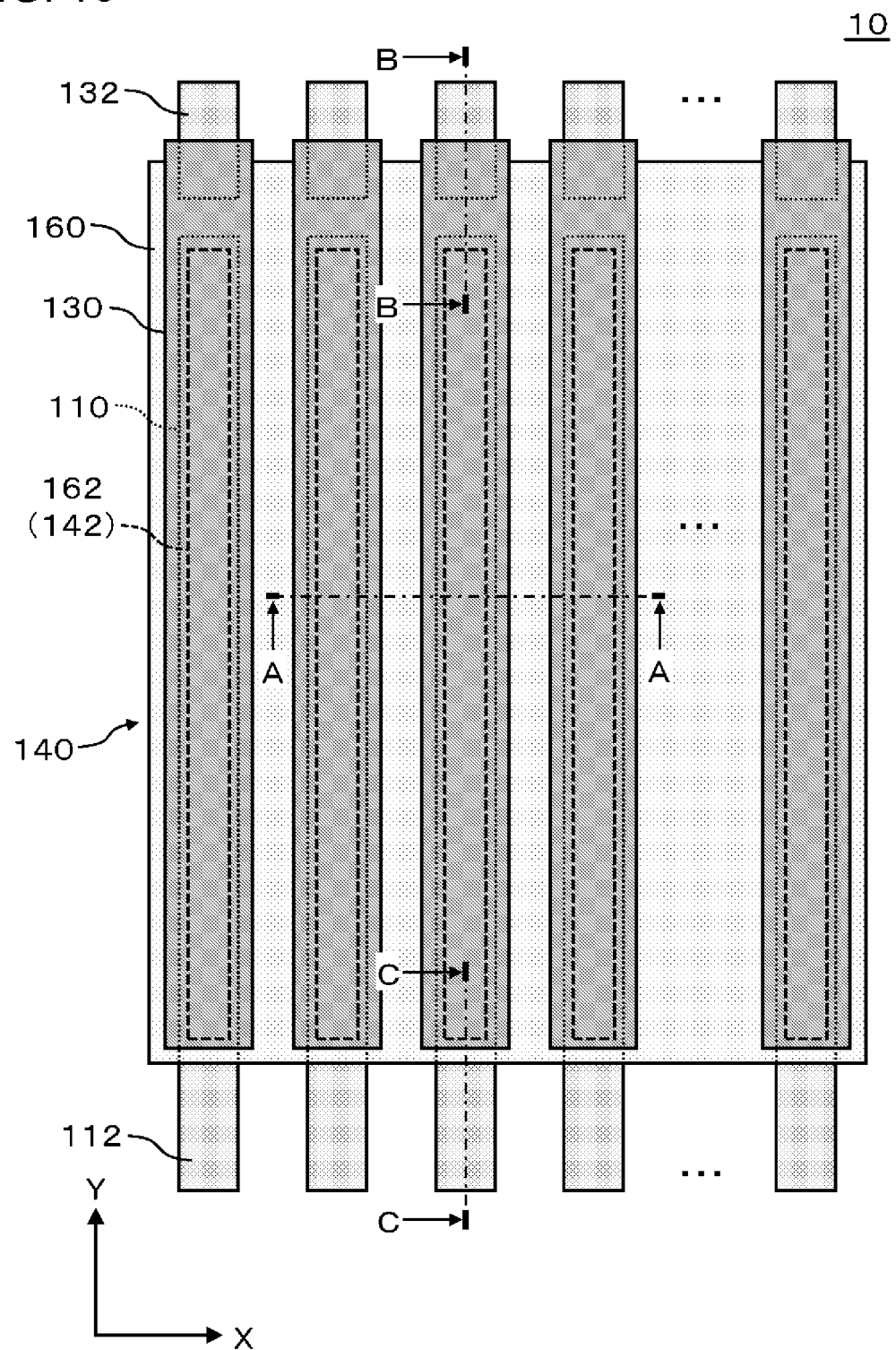
FIG. 15 is a plan view of a light-emitting device according to an example.
Figure 16:
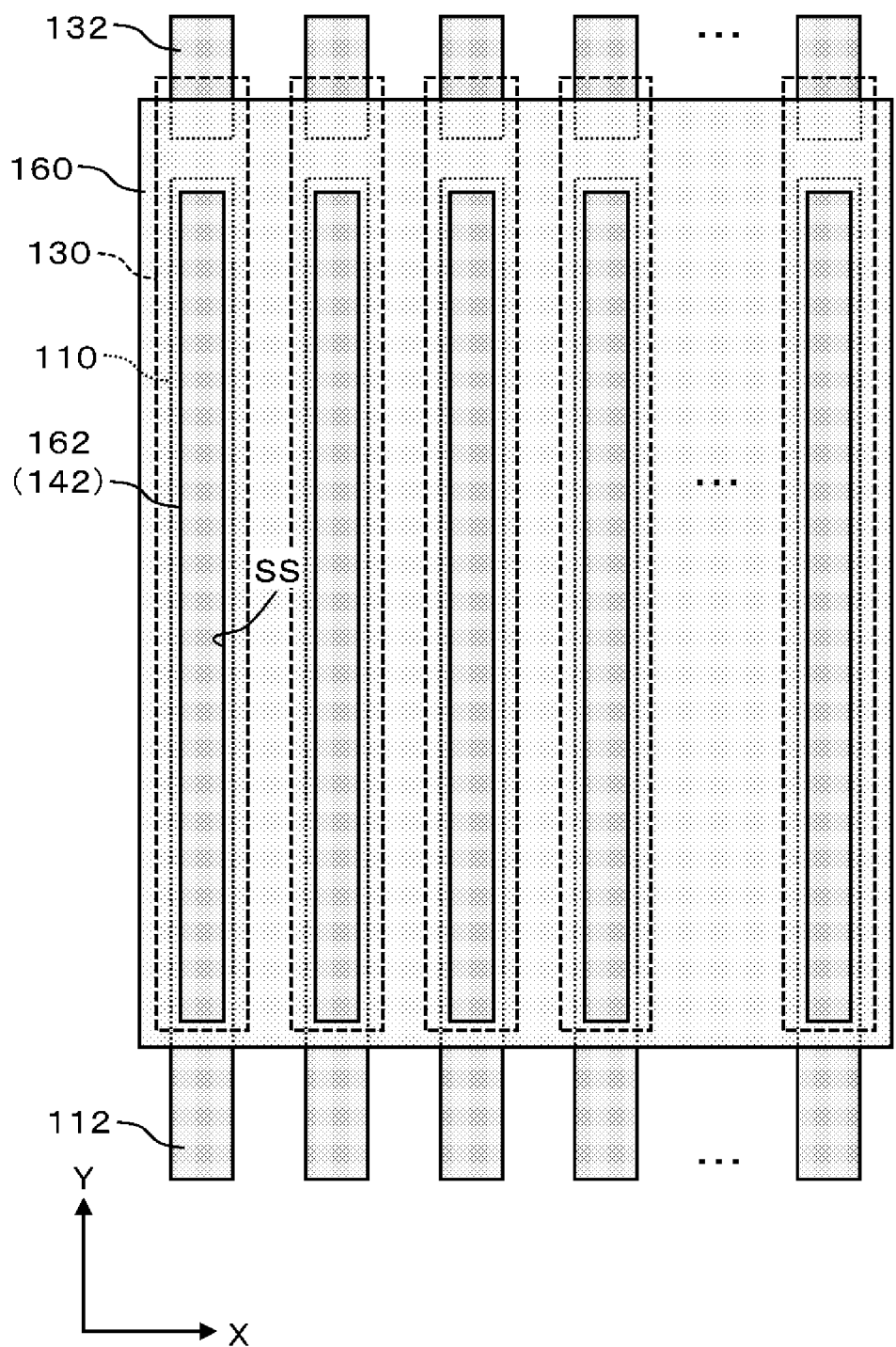
FIG. 16 is a diagram in which a second electrode is removed from FIG. 15.
Figure 17:
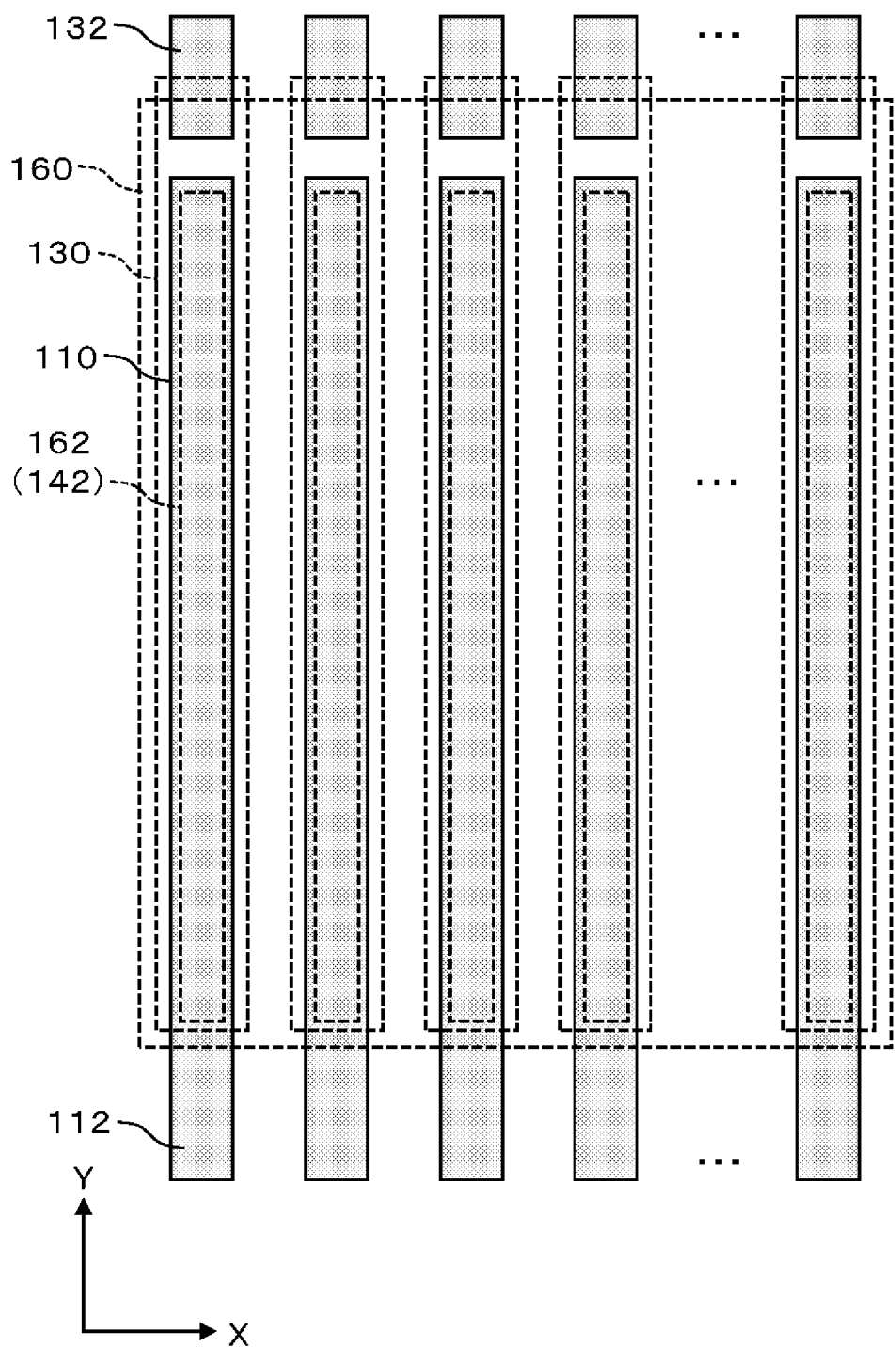
FIG. 17 is a diagram in which an insulating layer is removed from FIG. 16.
Figure 18:
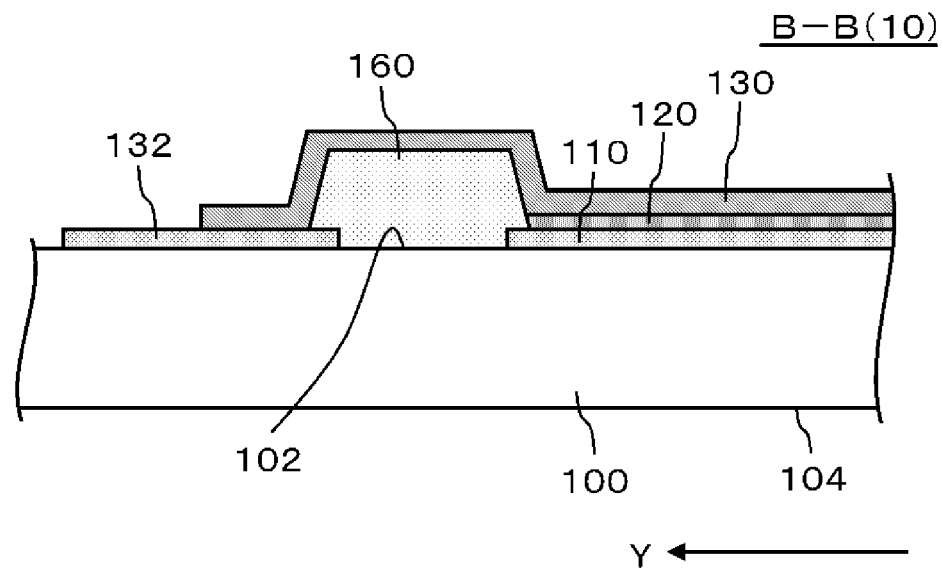
FIG. 18 is a B-B cross-sectional view of FIG. 15.
Figure 19:
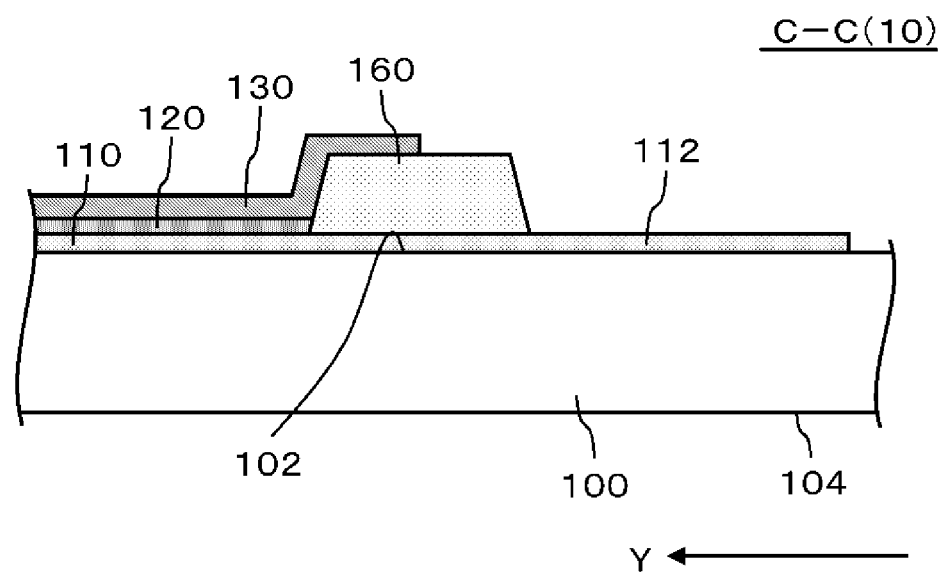
FIG. 19 is a C-C cross-sectional view of FIG. 15.

FIG. 15 is a plan view of a light-emitting device 10 according to an example. FIG. 16 is a diagram in which a second electrode 130 is removed from FIG. 15. FIG. 17 is a diagram in which an insulating layer 160 is removed from FIG. 16. FIG. 18 is a B-B cross-sectional view of FIG. 15. FIG. 19 is a C-C cross-sectional view of FIG. 15. The A-A cross-sectional view of FIG. 15 is as shown in FIG. 4. An organic layer 120, which is shown in FIGS. 4, 18, and 19, is removed from FIGS. 15-17 for ease of explanation.

Details of a plan layout of the light-emitting device 10 are described using FIGS. 15-17. The light-emitting device 10 includes a plurality of first electrodes 110, a plurality of first connection terminals 112, a plurality of second electrodes 130, a plurality of second connection terminals 132, and an insulating layer 160.

The plurality of first electrodes 110 extend in the Y direction and are aligned along the X direction. Each of the plurality of first electrodes 110 is connected to a respective one of the plurality of first connection terminals 112. Particularly in the example shown in FIG. 17, the first electrode 110 and the first connection terminal 112 are integral.

Each of the plurality of second electrodes 130 overlaps with a respective one of the plurality of first electrodes 110. The plurality of second electrodes 130 extend in the Y direction and are aligned along the X direction. Each of the plurality of second electrodes 130 is connected to a respective one of the plurality of second connection terminals 132.

The plurality of first connection terminals 112 may be connected by common wiring, and the plurality of second connection terminals 132 may be connected by common wiring. With such a configuration, a plurality of light-emitting elements 140 aligned along the X direction can be connected in parallel.

The insulating layer 160 extends across the plurality of first electrodes 110 and includes a plurality of openings 162. Each of the plurality of openings 162 overlaps with a respective one of the plurality of first electrodes 110. The plurality of openings 162 extend in the Y direction and are aligned along the X direction. Each opening 162 includes an edge extending in the Y direction and this edge functions as the side surface SS1 of the insulating layer 160. As it is clear from FIG. 4, the first electrode 110, the organic layer 120, and the second electrode 130 are laminated in the opening 162 of the insulating layer 160. In this manner, the light-emitting element 140 includes a region which functions as a light-emitting unit 142.

Details of the cross-sectional structure of the insulating layer 160 in the vicinity of the second connection terminal 132 are explained using FIG. 18. As shown in FIG. 18, the first electrode 110 includes an end facing the second connection terminal 132, the second connection terminal 132 includes an end facing the first electrode 110, and these ends are covered with the insulating layer 160. The second electrode 130 extends from the first electrode 110 side across to the second connection terminal 132 side via the upper region of the insulating layer 160. In this manner, the insulating layer 160 inhibits a direct contact between the first electrode 110 and the second electrode 130, that is, a short circuit between the first electrode 110 and the second electrode 130.

Details of the cross-sectional structure of the insulating layer 160 in the vicinity of the first connection terminal 112 are explained using FIG. 19. As shown in FIG. 19, the first electrode 110 extends across toward the first connection terminal 112 side via the lower region of the insulating layer 160, and is connected to the first connection terminal 112. The end of the second electrode 130 is located on the insulating layer 160. In this manner, the insulating layer 160 prevents a direct contact between the first electrode 110 (first connection terminal 112) and the second electrode 130, that is, a short circuit between the first electrode 110 (first connection terminal 112) and the second electrode 130.

In the present example also, as shown in FIG. 4, the insulating layer 160 includes a surface S. The surface S is along the second surface 104 of the substrate 100, and specifically, is parallel to the second surface 104 of the substrate 100. With such a configuration, it is possible to suppress the amount of light leakage to the opposite side of the light-emitting surface (second surface 104 of substrate 100) of the light-emitting device 10 via the surface S of the insulating layer 160.

As described above, although the embodiments and the example of the present invention have been set forthwith reference to the accompanying drawings, they are merely illustrative of the present invention, and various configurations other than those stated above can be adopted.

Exemplary reference embodiments will be appended below.

1. A light-emitting device including:
a substrate;
a plurality of light-emitting units located on the substrate, each light-emitting unit including a first electrode, an organic layer, and a second electrode; and
a light-transmitting insulating layer covering an end of each first electrode between light-emitting units adjacent to each other out of the plurality of light-emitting units,
in which the insulating layer is continuously located from an end of one first electrode of light-emitting units adjacent to each other to an end of the other first electrode,
in which an end of each second electrode between light-emitting units adjacent to each other is located on the insulating layer, and
in which a region overlapped with the insulating layer includes a region functioning as a light-transmitting region.

2. The light-emitting device according to 1,
in which the substrate includes a first surface, and a second surface on an opposite side of the first surface,
in which the plurality of light-emitting units are located on the first surface side,
in which the insulating layer includes a surface exposed from each second electrode between light-emitting units adjacent to each other, and
in which the surface of the insulating layer is along the second surface of the substrate.

3. The light-emitting device according to 2,
in which luminous flux of light emitted from the light-emitting device that is on the second surface side is greater than luminous flux of light emitted from the light-emitting device that is on the first surface side.

4. The light-emitting device according to 2 or 3,
in which each light-emitting unit includes the first electrode, the organic layer, and the second electrode in this order from the first surface of the substrate.

5. The light-emitting device according to any one of 1 to 4,
in which the plurality of light-emitting units include light-emitting units adjacent to each other along a first direction, and
in which a width of a region exposed from each second electrode between the light-emitting units adjacent to each other is wider than a width of each second electrode of the light-emitting units adjacent to each other in the first direction.

6. The light-emitting device according to 2,
in which a light distribution of the light-emitting device includes a first luminous intensity in a direction perpendicular to the second surface, and a second luminous intensity in a direction inclined by an angle φ from a direction perpendicular to the first surface, and
in which a luminous intensity ratio of the second luminous intensity with respect to the first luminous intensity is equal to or less than 10% in any case where the angle φ is equal to or greater than 0 degrees and equal to or less than 90 degrees.

7. A light-emitting device including:
a substrate;
a light-emitting unit located on the substrate, the light-emitting unit including a first electrode, an organic layer, and a second electrode;
a light-transmitting first insulating layer covering an end of the first electrode between light-emitting units adjacent to each other out of a plurality of the light-emitting units and having a tapered surface; and
a light-transmitting second insulating layer located opposite to the substrate across the light-emitting unit, the second insulating layer covering the first insulating layer and including a surface along the substrate.

8. The light-emitting device according to 7, further including a plurality of light-transmitting regions, each located between light-emitting units adjacent to each other,
in which the substrate includes a first surface and a second surface on an opposite side of the first surface,
in which the plurality of light-emitting units are located on the first surface side,
in which the second insulating layer includes the surface in each light-transmitting region, and
in which the surface of the second insulating layer is along the second surface of the substrate.

9. The light-emitting device according to 8,
in which luminous flux of light emitted from the light-emitting device on the second surface side is larger than luminous flux of light emitted from the light-emitting device on the first surface side.

10. The light-emitting device according to any one of 7 to 9,
in which the first insulating layer includes a same material as a material of the second insulating layer.

11. The light-emitting device according to 10,
in which a refractive index of the first insulating layer and a refractive index of the second insulating layer are the same.

12. The light-emitting device according to any one of 7 to 11,
in which each light-emitting unit includes the first electrode, the organic layer, and the second electrode in this order from the first surface of the substrate.

13. The light-emitting device according to any one of 7 to 12,
in which a light distribution of light emitted from the light-emitting device has a first luminous intensity in a direction perpendicular to the second surface, and a second luminous intensity in a direction inclined by an angle φ from a direction perpendicular to the first surface, and
in which a luminous intensity ratio of the second luminous intensity with respect to the first luminous intensity is equal to or less than 10% in any case where the angle φ is equal to or greater than 0 degrees and equal to or less than 90 degrees.

This application claims priority from Japanese Patent Application No. 2017-017410, filed Feb. 2, 2017, the disclosure of which is incorporated by reference in its entirety.

The invention claimed is:
1. An optical device comprising:
a substrate;
a plurality of light-emitting units located on the substrate, each light-emitting unit comprising a first electrode, an organic layer, and a second electrode;
a light-transmitting insulating layer covering an end of each first electrode between adjacent light-emitting units of the plurality of light-emitting units; and
a light receiving element,
wherein the insulating layer is continuously located from the end of one first electrode of each light-emitting unit to another end of another first electrode of an adjacent light-emitting unit,
wherein an end of each second electrode between adjacent light-emitting units is located on the insulating layer, and wherein a region overlapped with the insulating layer comprises a region functioning as a light-transmitting region, wherein the plurality of light-emitting units comprise light-emitting units adjacent to each other along a first directions, and wherein a width of a region exposed from each second electrode between the light-emitting units adjacent to each other is wider than a width of each second electrode of the light-emitting units adjacent to each other in the first direction.

2. The optical device according to claim 1, wherein the substrate comprises a first surface, and a second surface on an opposite side of the first surface, wherein the plurality of light-emitting units are located on a first surface side of the substrate, wherein the insulating layer comprises a surface exposed from each second electrode between light-emitting units adjacent to each other, and wherein the surface of the insulating layer is along the second surface of the substrate.

3. The optical device according to claim 2, wherein luminous flux of light emitted from the substrate on a second surface side of the substrate is greater than luminous flux of light emitted from the substrate on the first surface side.

4. The optical device according to claim 2, wherein each light-emitting unit comprises the first electrode, the organic layer, and the second electrode in this order from the first surface of the substrate.

5. The optical device according to claim 2, wherein a light distribution of light emitted from the substrate comprises a first luminous intensity in a direction perpendicular to the second surface, and a second luminous intensity in a direction inclined by an angle $\varphi$ from a direction perpendicular to the first surface, and wherein a luminous intensity ratio of the second luminous intensity with respect to the first luminous intensity is equal to or less than 10% in any case where the angle $\varphi$ is equal to or greater than 0 degrees and equal to or less than 90 degrees.

6. An optical device comprising:

a substrate;

a plurality of light-emitting units located on the substrate, each light-emitting unit comprising a first electrode, an organic layer, and a second electrode;

a light-transmitting first insulating layer covering an end of each first electrode between adjacent light-emitting units of a plurality of the light-emitting units and comprising a tapered surface;

a light-transmitting second insulating layer located opposite to the substrate across the plurality of light-emitting units, the second insulating layer covering the first insulating layer and comprising a surface along the substrate; and a light receiving element, wherein the plurality of light-emitting units comprise light-emitting units adjacent to each other along a first direction, and wherein a width of a region exposed from each second electrode between the light-emitting units adjacent to each other is wide than a width of each second electrode of the light-emitting units adjacent to each other in the first direction.

7. The optical device according to claim 6, further comprising a plurality of light-transmitting regions, each region located between light-emitting units adjacent to each other, wherein the substrate comprises a first surface and a second surface on an opposite side of the first surface, wherein the plurality of light-emitting units are located on a first surface side of the substrate, wherein the surface of the second insulating layer is comprised in each light-transmitting region, and wherein the surface of the second insulating layer is along the second surface of the substrate.

8. The optical device according to claim 7, wherein luminous flux of light emitted from the substrate on a second surface side of the substrate is larger than luminous flux of light emitted from the substrate on the first surface side of the substrate.

9. The optical device according to claim 7, wherein each light-emitting unit comprises the first electrode, the organic layer, and the second electrode in this order from the first surface of the substrate.

10. The optical device according to claim 7, wherein a light distribution of light emitted from the substrate comprises a first luminous intensity in a direction perpendicular to the second surface, and a second luminous intensity in a direction inclined by an angle q from a direction perpendicular to the first surface, and wherein a luminous intensity ratio of the second luminous intensity with respect to the first luminous intensity is equal to or less than 10% in any case where the angle $\varphi$ is equal to or greater than 0 degrees and equal to or less than 90 degrees.

11. The optical device according to claim 6, wherein the first insulating layer comprises a same material as a material of the second insulating layer.

12. The optical device according to claim 11, wherein a refractive index of the first insulating layer and a refractive index of the second insulating layer are a same.

13. An optical device comprising:

a substrate;

a plurality of light-emitting units located on the substrate, each light-emitting unit comprising a first electrode, an organic layer, and a second electrode;

a light-transmitting first insulating layer covering an end of each first electrode between adjacent light-emitting units of a plurality of the light-emitting units and comprising a tapered surface;

a light-transmitting second insulating layer located opposite to the substrate across the plurality of light-emitting units, the second insulating layer covering the first insulating layer and comprising a surface along the substrate; and a light receiving element, wherein a refractive index of the first insulating layer and a refractive index of the second insulating layer are a same.

14. The optical device according to claim 13, further comprising a plurality of light-transmitting regions, each region located between light-emitting units adjacent to each other, wherein the substrate comprises a first surface and a second surface on an opposite side of the first surface, wherein the plurality of light-emitting units are located on a first surface side of the substrate, wherein the surface of the second insulating layer is comprised in each light-transmitting region, and wherein the surface of the second insulating layer is along the second surface of the substrate.

15. The optical device according to claim 14, wherein luminous flux of light emitted from the substrate on a second surface side of the substrate is larger than luminous flux of light emitted from the substrate on the first surface side of the substrate.

16. The optical device according to claim 14, wherein each light-emitting unit comprises the first electrode, the organic layer, and the second electrode in this order from the first surface of the substrate.

17. The optical device according to claim 14, wherein a light distribution of light emitted from the substrate comprises a first luminous intensity in a direction perpendicular to the second surface, and a second luminous intensity in a direction inclined by an angle $\varphi$ from a direction perpendicular to the first surface, and wherein a luminous intensity ratio of the second luminous intensity with respect to the first luminous intensity is equal to or less than 10% in any case where the angle $\varphi$ is equal to or greater than 0 degrees and equal to or less than 90 degrees.

18. The optical device according to claim 13, wherein the first insulating layer comprises a same material as a material of the second insulating layer.

\* \* \* \* \*